(12) United States Patent
Spivak et al.

(10) Patent No.: US 7,834,514 B2
(45) Date of Patent: Nov. 16, 2010

(54) WIRELESS SURFACE ACOUSTIC WAVE-BASED PROXIMITY SENSOR, SENSING SYSTEM AND METHOD

(75) Inventors: Alexander Spivak, Eden Prairie, MN (US); Chuang-Chia Lin, Lakeville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 473 days.

(21) Appl. No.: 11/977,301

(22) Filed: Oct. 24, 2007

(65) Prior Publication Data
US 2009/0109048 A1  Apr. 30, 2009

(51) Int. Cl.
G01B 7/00 (2006.01)
G01R 33/038 (2006.01)
H01L 41/12 (2006.01)
H01L 41/00 (2006.01)

(52) U.S. Cl. ............... 310/313 R; 310/26; 324/207.13; 340/539.23; 340/686.6

(58) Field of Classification Search ............ 310/26, 310/313 A; 324/207.13; 340/539.15, 539.23, 340/545.3, 547, 551–552, 567, 686.1
See application file for complete search history.

(56) References Cited

U.S. PATENT DOCUMENTS 5,966,008 A * 10/1999 Maier et al. ............... 324/96
6,664,708 B2 * 12/2003 Shlimak et al. ........ 310/313 R
6,813,947 B2 * 11/2004 Dollinger et al. ........... 73/432.1
6,949,868 B2 *  9/2005 Iseki ..................... 310/323.02
7,065,331 B2 *  6/2006 Korden et al. ............ 455/150.1
7,515,046 B2 *  4/2009 Funo et al. ............... 340/572.1
2009/0146645 A1 *  6/2009 Steinich et al. ........ 324/207.13

FOREIGN PATENT DOCUMENTS

JP  2004032052 A *  1/2004

\* cited by examiner

*Primary Examiner*—Burton Mullins
(74) *Attorney, Agent, or Firm*—Scott D. Wofsy; Edwards Angell Palmer & Dodge LLP

(57) ABSTRACT

The subject invention is related to wireless proximity sensor and sensing system for detecting the position of an object. The system includes a transceiver for providing wireless communication with a passive wireless surface acoustic wave (SAW) proximity sensor. The wireless proximity sensor receives a wireless signal from the transceiver, which powers the SAW device and in turn transmits a signal back to the transceiver that includes information about the position of an object. The wireless proximity sensor uses one or more SAW devices with a sensing element made of magnetostrictive material, in conjunction with one or more magnets and one or more targets that are positioned relative to an object. The movement of the target(s) in relation to the proximity sensor operatively produces a mechanical response due to the shift in the magnetic field of the sensing element. The sensing element in turn enhances the magnetic field of the SAW device to which it is attached, and this information is transmitted to the transceiver as information about the position of an object.

26 Claims, 4 Drawing Sheets

WIRELESS SURFACE ACOUSTIC WAVE-BASED PROXIMITY SENSOR, SENSING SYSTEM AND METHOD

BACKGROUND OF THE INVENTION

1. Field of the Invention

The subject invention is related to proximity sensors for detection of a position of an object, and more particularly, to a wireless proximity sensor and sensing system that uses surface acoustic wave (SAW) technology to reduce weight and complexity to meet the rigorous demands of the aviation industry and other position sensing applications.

2. Description of the Related Art

Proximity sensors have long been used to indicate the position of an object on an aircraft or other vehicle (e.g., whether a door or hatch is open or closed). These proximity sensors are typically the current sensing induction type and heavily armored for isolation. The proximity sensor generates an electromagnetic field to sense metal objects passing within a few tenths of inches.

The heavy isolation armor or shielding and wire required are highly undesirable in the field of weight sensitive aircraft design. By one estimate for fixed wing commercial aircraft, each extra pound has a recurring cost of over U.S. $500, a non-recurring cost of over U.S. $5000, and a life cycle cost of U.S. $100,000. For rotary wing craft (e.g., helicopters), the costs are typically twice that of fixed wing aircraft. Yet, a Boeing 787 airplane has approximately 150 proximity sensors with over 40 pounds of associated wire.

While the aviation industry is looking for alternatives, the currently available options have their own disadvantages. One alternative is a voltage sensing capacitive type sensor, which may require heavy isolation hardware as a result of capacitive coupled voltage due to electromagnetic interference. Conductive fluids and water condensation pose additional problems for capacitive type sensors. Magnetic or optical interrupt switches, although much lighter due to less shielding, are failure prone in the harsh conditions of aviation. Further, magnetic switches attract ferrous metal filings that inhibit the detection of a near/far condition, resulting in false condition reporting and low reliability. Optical switches suffer from foreign object contamination, such as dirt, which again reduces the performance of the device. Further yet, each of these sensors uses hardwired connections to power and report state. Wire requires a number of aircraft interactions for installation that drives up cost in both design and manufacturability. Additionally, wire is heavy and difficult to troubleshoot when sensor operation fails.

SAW devices having a magnetostrictive element are one type of electronic component that may be used to address the problems of weight sensitive proximity detection of objects in aircraft and other applications. Generally, SAW devices generate guided acoustic waves along a surface of the device. SAW devices are typically fabricated on single crystal anisotropic substrates that are also piezoelectric. SAW devices typically include one or more pairs of intertwined interdigital electrodes that form transducers (known as an interdigital transducer or IDT) to convert the electrical signals applied to the device into the electromechanical surface acoustic waves generated in the device and vice versa. However, SAW devices may also be present in different classes of acoustic devices such as micro-strip couplers and acoustic reflectors/mirrors etc., depending on the particular device configuration employed.

One such SAW device is disclosed in U.S. Pat. No. 4,078,186 which discloses a magnetically tuned SAW device having a thin magnetostrictive film deposited only on the surface between its input and output transducers. A variable DC magnetic field is applied to the film by connecting the poles of an electromagnet to a DC supply. The electromagnet is then placed in line with the plane of the film to vary its magnetic field characteristics. A corresponding continuous variance in the delay or phase shift of the surface acoustic wave is produced thereby. This configuration however, has several drawbacks that do not make it ideal for proximity sensing applications. These drawbacks include, but are not limited to, the stationary positioning of the electromagnet and the weight of the wiring necessary to supply DC current to the poles of the electromagnet.

The present invention discloses a number of improvements over this and other known SAW devices and methods for proximity sensing, the features and advantages of which are described herein.

SUMMARY OF THE INVENTION

The subject invention is directed to a wireless proximity sensor, wireless proximity sensing system, and method that uses SAW technology in conjunction with magnetostrictive materials to detect the position of objects. Such a sensor and sensing system is advantageous because it eliminates the need for heavy, complex and difficult to maintain sensors and sensor wiring. In addition, the device fabrication is simpler and requires fewer mask and processing steps with the added benefit of small proximity sensor device dimensions.

A first embodiment of the wireless proximity sensor according to the present invention is a wireless proximity sensor for sensing the position of an object comprising a body formed of a substrate material having an upper surface, a lower surface, a first end and a second end. The sensor of this embodiment is further comprised of one or more IDTs provided on the upper surface of the first end of the body, wherein each of the IDTs has at least one associated antenna. However, other classes of SAW devices may be used such as micro-strip couplers and acoustic reflectors/mirrors. A sensing element formed of magnetostrictive material is also attached to or deposited on the substrate material. One or more magnets are further provided as well as one or more movable targets. The target, made of ferromagnetic material, is positioned to provide a reference point of the position of an object. The movement of the target acts upon the magnetic field of the magnet, which can be attached to any one of the surfaces of the sensing element or the SAW device body by an elastic attaching means disposed between the magnet and the sensing element. The means for attaching may include a biasing means such as an elastic rod or spring or other means known in the art. The magnet is therefore capable of movement with respect to the sensing element and the SAW device body. The resultant change in distance and position of the movement of the magnet relative to the sensing element induces a mechanical response in the sensing element(s) and the SAW device attached thereto, which provides information about the position of the object of which the desired position is to be detected.

Various aspects and variations of the embodiments of the invention are further described below. The means for attaching of the first embodiment may include a biasing means such as an elastic rod, spring or the like. The substrate material of the body may be one of Quartz, $LiNbO_3$, AlN, $AlPO_4$, $LiTaO_3$, Lagasite, $Bi_4Ge_3O_{12}$ (BGO), GaAs, PZT or any equivalent known in the art. In addition, the magnetostrictive material of the sensing element may be selected from the group consisting of TERFENOL-D, Galfenol, Cobalt, and Nickel or any known equivalent thereof.

The present invention also envisions variations on the geometry, thickness and location of the magnetostrictive material of the sensing element in relation to the sensor body. For example, the magnetostrictive material can be a thin film deposited on the upper surface of the substrate material between the first end and the second end of the body. Alternatively, the magnetostrictive material of the sensing element can be a block of bulk magnetostrictive material attached to the upper, lower, or side surfaces of the substrate material of the body. Further, the bulk material may be either larger or smaller than the sensing element depending upon the mechanical response of the sensing element desired due to the change in the magnetic field.

The IDT discussed above is adapted and configured to convert electromagnetic energy from one of its associated antennas into surface acoustic wave energy for propagation through the sensing element. It is further adapted and configured to convert surface acoustic wave energy back into electromagnetic energy to the same or a different antenna to provide the object position information.

A wireless proximity sensing system according to an embodiment of the present invention includes the wireless proximity sensor and various sensor embodiments described above, and further includes a transceiver such as a computer or a processor, for generating a query signal, which requests information about a position of an object from the proximity sensor device. The transceiver has one or more associated antennae that wirelessly receive information about the position of an object from the SAW device and also transmits a request for information to the SAW device and receives information from the SAW device.

Those skilled in the art would readily appreciate that the components described above with respect to the proximity sensor also pertain to the proximity sensing system and method of the present invention.

These and other aspects and advantages of the subject invention will become more readily apparent from the following description of the preferred embodiments taken in conjunction with the drawings.

BRIEF DESCRIPTION OF THE DRAWINGS

So that those skilled in the art to which the subject invention appertains will readily understand how to make and use the apparatus of subject invention without undue experimentation, preferred embodiments thereof will be described in detail herein below with reference to certain figures, wherein.

DETAILED DESCRIPTION OF THE INVENTION

Figure 1:
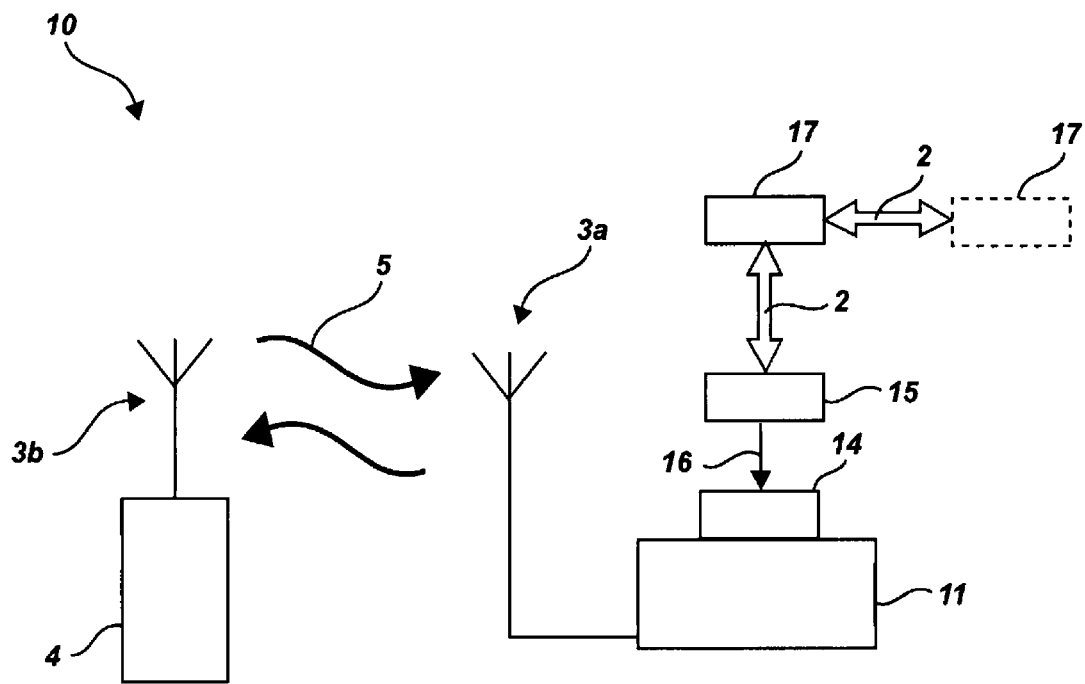
FIG. 1 shows a schematic representation of the proximity sensing system of the present invention.

The subject invention relates to a wireless proximity sensor, system and method for detecting the presence of both moving and stationary objects. FIG. 1 shows a schematic representation of the proximity sensing system 10 of an embodiment of the present invention. The transceiver 4 sends through its associated antenna 3*b* a request for information 5 about a position of an object. The request for information 5 sent by the transceiver 4 powers the SAW device, enabling it to operate wirelessly within the proximity sensing system 10.

The wireless proximity sensing system 10 generally includes one or more first antennas 3*a* and one or more second antennas 3*b*. The first antenna 3*a* is associated with the proximity sensor for wirelessly receiving the request signal from the transceiver 4 and transmitting a response that includes information about a position of an object based on a location of the magnet 15 relative to the body 11 of the SAW device and relative to the sensing element 14. The second antenna 3*b* receives the information from the first antenna 3*a* and sends the information to the transceiver 4.

Those skilled in the art would readily appreciate that the moveable target 17 is adapted and configured to act upon a magnet 15. The moveable target 17 is made of a ferromagnetic material with high magnetic permeability such as Iron, Cobalt, Nickel or any known equivalent in the art, and is further associated with the position of the object to be detected. The target 17 undergoes movement 2 as indicated by the dashed lines, relative to an object (not shown) whose position is to be determined by the sensing system 10. As a result, a change in the position of the magnet 15 is produced in response to the magnetic attraction between the target 17 and the magnet 15. The movement 6 of the magnet 15 can be constrained by an attaching member 16, such as an elastic rod, spring, elastic attaching member or biasing member. The magnet 15 enhances the magnetic field of the magnetostrictive material of the sensing element 14, which may be attached either during the masking process, by an adhesive or by other means for attaching known in the art to the body 11 of the SAW device.

Due to the shift in the magnetic field, the sensing element 14 undergoes a mechanical response, which in turn produces a mechanical response in the body 11 of the SAW device to which it is attached. The change in the magnetic field of the magnetostrictive material of the sensing element 14 is characterized by a magnitude and/or phase shift. The pattern of changes of the relative difference between the neutral and changed magnetic fields, as expressed through the magnitude or phase shift, is the source of the information 5 of the position of an object (not shown), which is relayed to the antenna 3*a* back to antenna 3*b*, and subsequently received by the transceiver 4.

The configuration of the SAW devices used in the wireless proximity sensor and sensing system according to the present invention may be any one of known SAW device configurations known in the art. Conventionally, these configurations may include building blocks such as micro-strip couplers, acoustic mirrors, and IDTs. Here, the SAW device building blocks are identified as IDTs for simplicity. The IDTs of both configurations include electrodes made of magnetostrictive material such as TERFENOL-D, Galfenol, Cobalt, Nickel or any known equivalent in the art.

Figure 2:
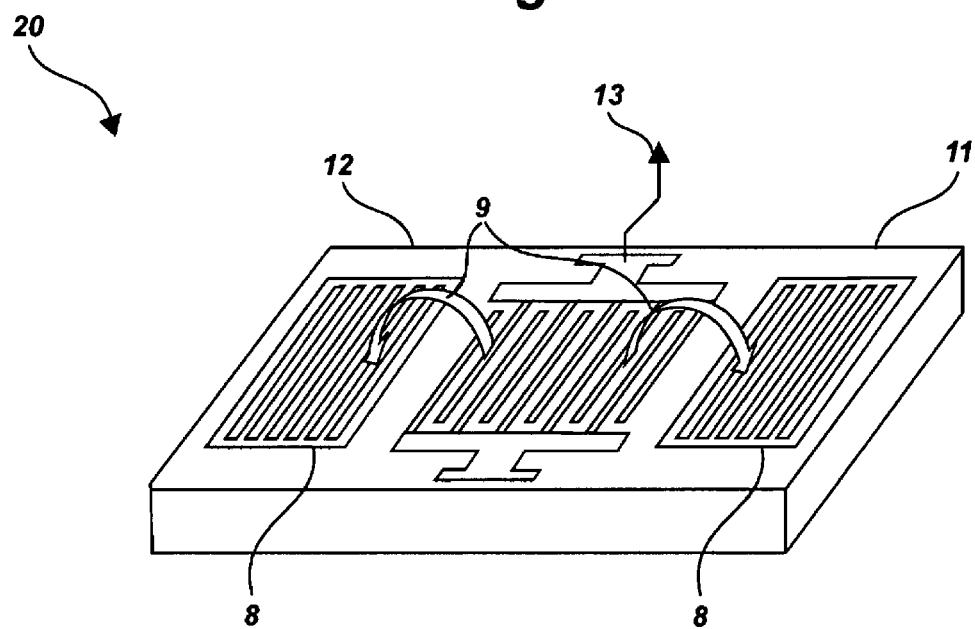
FIG. 2 shows a SAW device having a single IDT and two acoustic reflectors used within a wireless proximity sensor according to an embodiment of the present invention.
Figure 3:
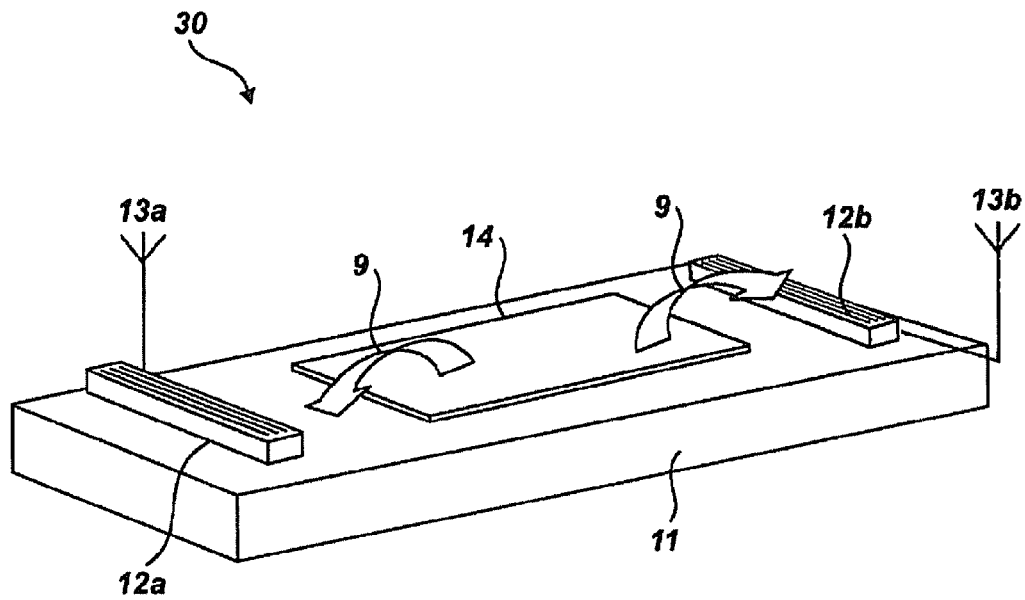
FIG. 3 shows a SAW device having multiple IDTs used within the proximity sensor according to an embodiment of the present invention.

One configuration of a SAW device according to the present invention is a basic 1-port SAW resonator 20 having a single IDT as depicted in FIG. 2. Alternatively, a 2-port SAW sensor having multiple transducers, IDTs 12, 12*a*, and 12*b* may be used, as shown in FIG. 3. The IDTs according to the present invention are adapted and configured to convert electromagnetic energy from one antenna into surface acoustic wave energy. In FIG. 3, the propagation of SAW energy 9 through a sensing element 14, located on the surface of the SAW device 30 is shown. The IDTs 12*a* and 12*b* are further adapted and configured to convert surface acoustic wave energy 9 back into electromagnetic energy for transmission to one of the antennas 13*a* and 13*b*, information from which is eventually received by transceiver 4 of FIG. 1. One of ordinary skill in the art would appreciate that the aforementioned electromagnetic energy and surface acoustic wave energy 9 contain either a request for or information about the position of an object.

The 1-port SAW resonator configuration of FIG. 2 depicts a SAW device 20 having a body 11 formed of a substrate material having an upper surface, a lower surface, a first end and a second end. The SAW device 20 has only one IDT 12 provided on the upper surface of the body 11 with an associated antenna 13. The device 20 further comprises a sensing element (not shown) formed of magnetostrictive material deposited on the substrate material between the first end and the second end of the body 11. In the single transducer configuration of FIG. 2, the SAW device 20 is further comprised of two grating reflectors 8 or mirrors, which reflect surface acoustic waves 9 and generate a standing wave between the two reflectors 8. In this embodiment, the sensing element (not shown) is a thin film of magnetostrictive material deposited between the transducer 12 and at least one of the resonators 8 on the upper surface of the body 11.

An alternative 2-port SAW configuration, also known as a delay line, is shown in FIG. 3 and depicts a SAW device 30 having two IDTs 12*a* and 12*b* provided on the upper surface of the first end of the body 11 with associated antennas 13*a* and 13*b* respectively. For purposes of illustration only, the remaining figures utilize only one of the 2-port SAW device 30 configurations of FIG. 3. However, it is to be understood that the present invention envisions the use of an array of either the single or multi port configurations. Like the 1-port SAW resonator configuration, the 2-port SAW device 30 of FIG. 3 has a body 11 formed of a substrate material having an upper surface, a lower surface, a first end and a second end. The substrate material of the body 11 may be selected from any known piezoelectric single crystal material or piezoelectric on dielectric laminate material. Some substrate materials that may typically be used in the present invention are Quartz, $LiNbO_3$, AlN, $AlPO_4$, $LiTaO_3$, Lagasite, $Bi_4Ge_3O_{12}$ (BGO), GaAs, PZT or any equivalent known in the art.

The wireless proximity sensor and sensing system of FIG. 3 further include a SAW device 30 with a sensing element 14 formed of magnetostrictive material deposited on the substrate material between the first end and the second end. The location of the sensing element 14 may vary. For example, the magnetostrictive material of the sensing element 14 may be deposited on the top surface as shown in FIG. 3 or attached to a side or bottom surface of the substrate material of the body 11. The magnetostrictive material of the sensing element 14 is typically made of TERFENOL-D, Galfenol, Cobalt, Nickel or any known equivalent in the art.

Figure 4:
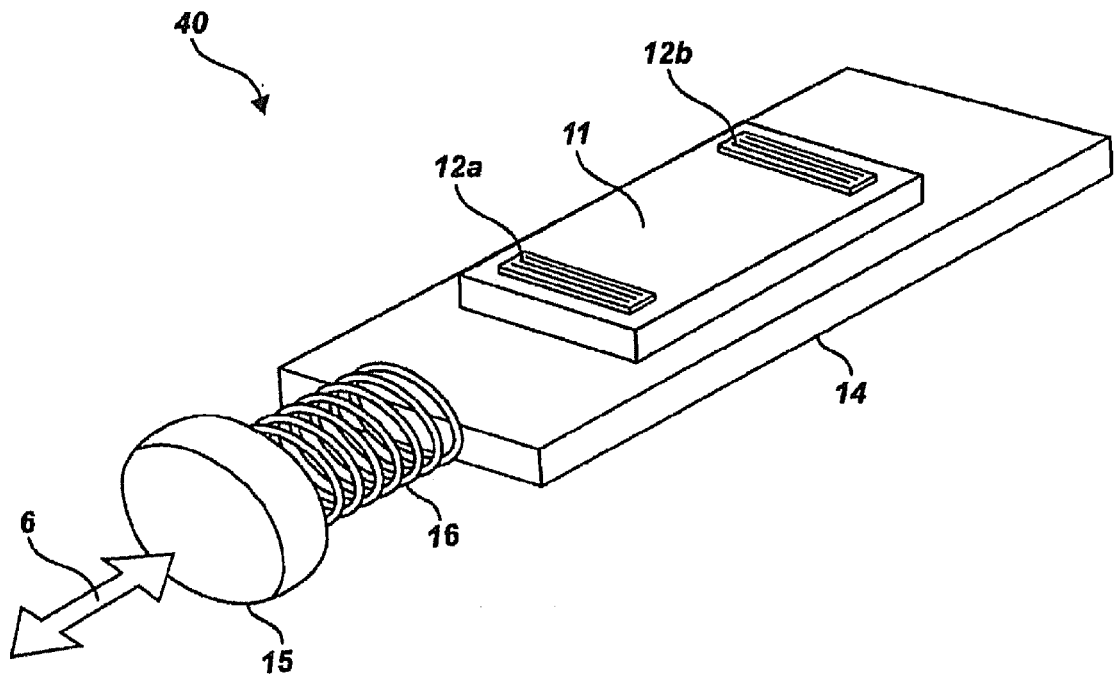
FIG. 4 shows a wireless proximity sensor having a magnet connected to the substrate by an elastic member according to an embodiment of the present invention.

The magnetostrictive material of the sensing element 14 may also vary in thickness, geometric shape and relative size in relation to the body 11. With regard to thickness, the magnetostrictive material may be a thin film or a block of bulk material with a long strip geometric shape. The block of bulk material of the sensing element 14 may be larger than the body 11, for example approximately twice the size of the body 11. Alternatively, the block of bulk material of the sensing element 14 may be smaller than the body 11, for example one-third of the size of the body 11. The size chosen is based on the desired mechanical response characteristics in order to maximize strain transfer on the sensing element 14. The wireless proximity sensor 40 of FIG. 4 shows a block of bulk magnetostrictive material of the sensing element 14 that is larger than the body 11 of the SAW device.

Figure 5:
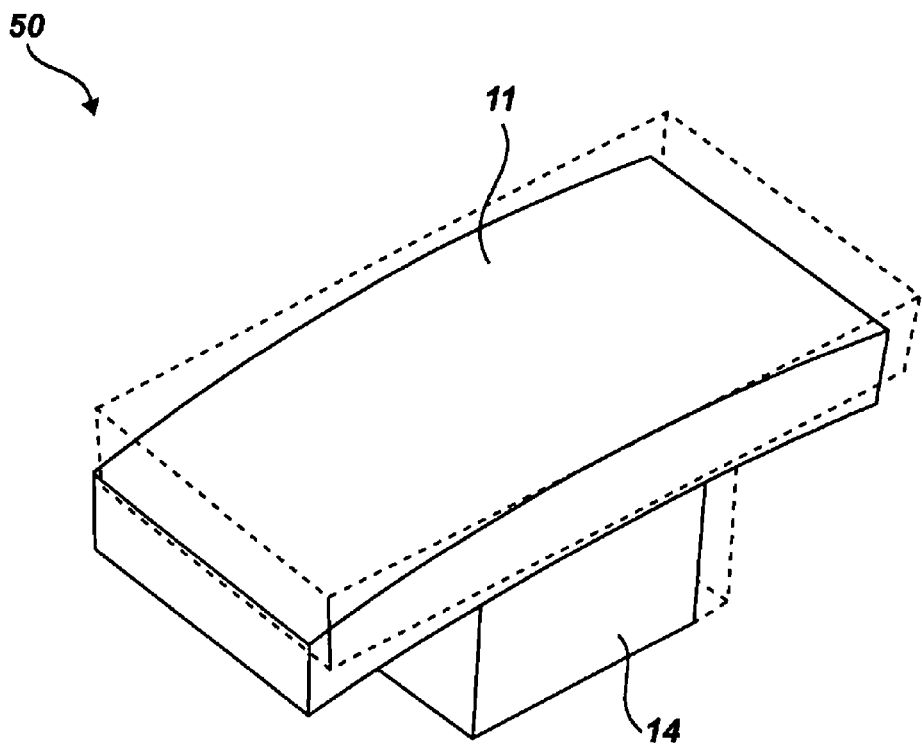
FIG. 5 shows a SAW device having a sensing element made of a block of bulk magnetostrictive material attached according to an embodiment of the present invention.

FIG. 5, alternatively, shows a SAW device 50 having a block of bulk magnetostrictive material of the sensing element 14 that has smaller dimensions than that of the substrate material of the body 11. FIG. 5 further shows how the sensing element 14 and body 11 respond mechanically to the presence of a magnetic field, as indicated by the dashed lines. The right portion of the body 11 is illustrated in a bent position relative to the neutral position. The mechanical movement of the sensing element 14 is caused by the magnetic field induced by the magnet 15 (not shown) according to the present invention. The mechanical response of the sensing element 14 in turn causes a mechanical response of the body 11 of the SAW device. The response, in the form of a phase or magnitude shift, is then translated to the transceiver 4 as information 5 about the position of an object relative to the target 17, as shown in FIG. 1. Although only one magnet 15 is shown, one or more magnets 15 may be used.

Turning again to FIG. 4, a wireless proximity sensor 40 of the present invention is shown in which the magnet 15 is operatively positioned with respect to the body 11 for providing a reference point of a position of an object. As discussed above, the magnet 15 is adapted and configured to induce a magnetic field in the sensing element 14. The magnet 15 is connected to the sensing element 14 by an attaching member 16, disposed between the magnet 15 and the sensing element 14. Here, the magnet 15 is attached to a side surface of the sensing element 14. However, the magnet 15 may be attached to any one of a side, upper or lower surface of the sensing element 14 such that the magnet 15 and a surface of the sensing element 14 are connected. In another embodiment, the magnet 15 is alternatively attached to the body 11. The elastic attaching member 16 allows for movement of the magnet 15 in relation to the sensing element 14. The elastic attaching member 16 may be an elastic rod, spring or coil as shown or any other biasing member known in the art. The movement of the magnet 15 can be one or more of horizontal, vertical, or rotational movement in relation to the sensing element 14, depending on the object position sensing application. As the magnet 15 moves closer to the sensing element 14, the attaching member 16 compresses, and the magnetic field in the sensing element 14 changes.

Figure 6:
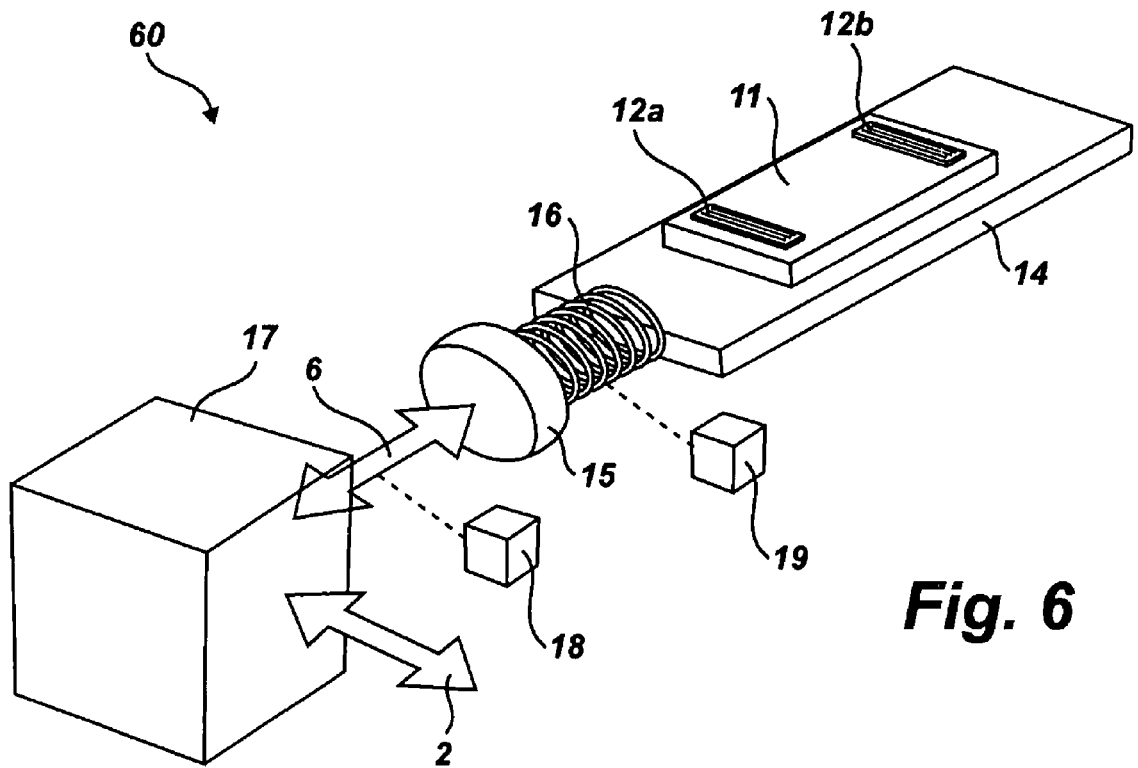
FIG. 6 shows a wireless proximity sensor according to an embodiment of the present invention having a movable target.

Referring to FIG. 6, there is shown an embodiment in which the wireless proximity sensing system 60 may further include a movable target 17 operatively positioned to produce a change in the magnetic field induced in the sensing element 14 based on the movement 2 of the movable target 17 with respect to the magnet 15 according to yet another embodiment of the present invention. Although only one movable target 17 is shown, one or more movable targets 17 may be used. The target 17 is made of a ferromagnetic material with a high magnetic permeability, such as Iron, Cobalt, Nickel or any equivalent known in the art. In addition, the target can either be a permanent magnet or a block of magnetic material. As the target 17 moves, the magnet 15 reacts which either compresses or decompresses the elastic member 16. In one embodiment, stoppers 18 and 19 may be disposed between the target 17 and the magnet 15, between the magnet 15 and the elastic member 16, or between the elastic member 16 and the sensing element 14. The stoppers 18 and 19 are operatively positioned in order to limit the movement 6 of either the target 17 or the magnet 15 in relation to the sensing element 14. By limiting the range in movement 6 of the magnet 15, the range of mechanical response of the sensing element 14 and SAW body 11 can be manipulated as desired for a given proximity sensing application.

Figure 7:
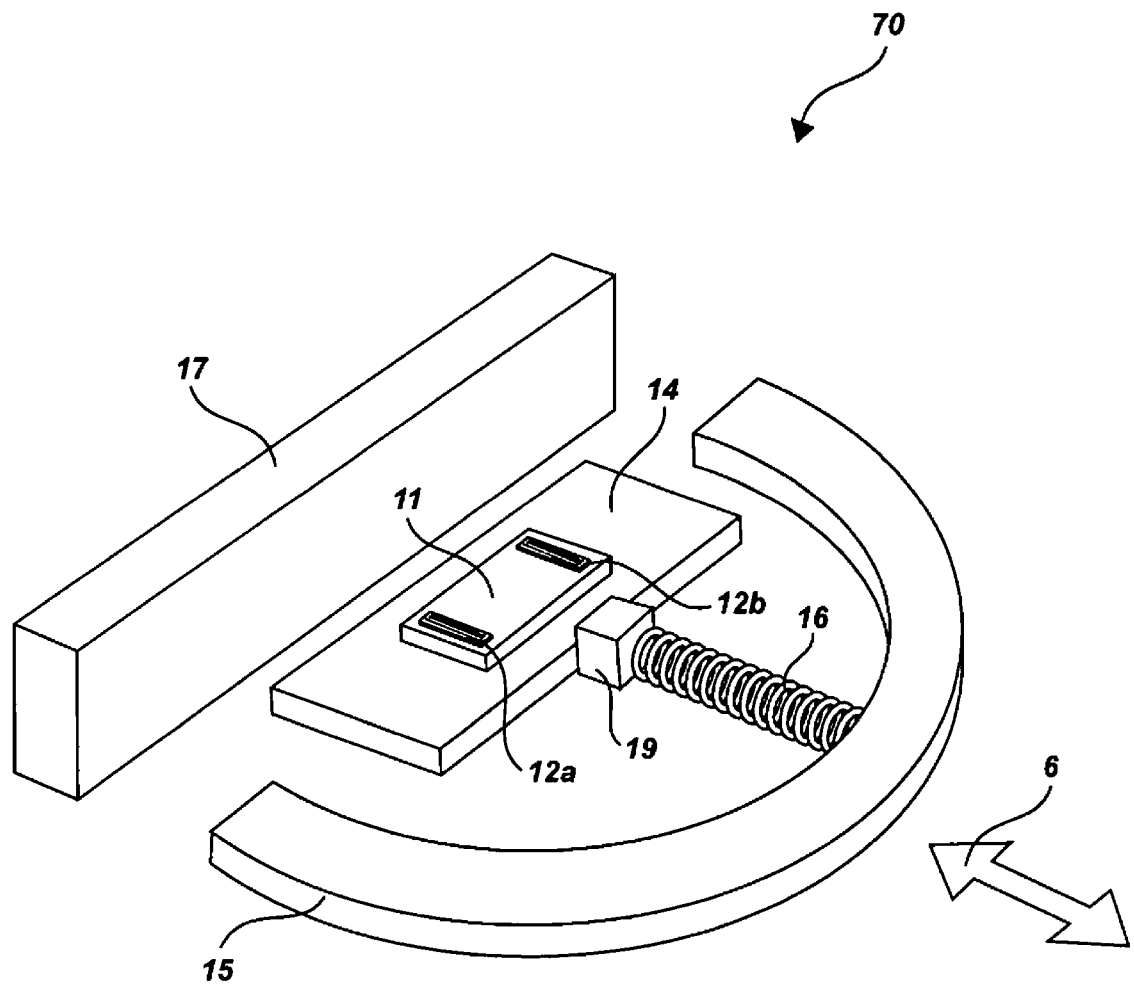
FIG. 7 shows a wireless proximity sensor according to an embodiment of the present invention having a movable target with optional stoppers inserted between the elastic member and the sensing element.

Referring to FIG. 7, there is shown an additional embodiment in which the wireless proximity sensor and sensing system 70 may further includes a movable target 17. The target 17 can be operatively positioned, such that the sensing element 14 is disposed in between the magnet 15 and the target 17. The magnet 15 is shown in a u-shape, however, the magnet 15 can be any shape adapted and configured to interact with movable target 17. Further, the target 17 is shown having a rectangular shape, however the target 17 can be any shape configured to interact with the magnet 15. Stopper 19 is also shown to be disposed between the elastic member 16 and the sensing element 14. The stopper 19 may be used to limit a desired movement 6 and compression of the elastic member 16 in response to the movement of the target 17.

Although the subject invention has been described with respect to preferred embodiments, those skilled in the art will readily appreciated that changes or modifications thereto may be made without departing from the spirit or scope of the subject invention as defined by the appended claims.

What is claimed is:

1. A wireless proximity sensor for sensing the position of an object comprising:
  a) a body formed of a substrate material having an upper surface, a lower surface, a first end and a second end;
  b) at least one interdigital transducer provided on a surface of the body, wherein each of the at least one interdigital transducers has at least one first antenna associated therewith;
  c) at least one sensing element formed of magnetostrictive material provided on the substrate material;
  d) at least one magnet operatively positioned with respect to the body for providing a reference point of a position of an object, wherein the at least one magnet is adapted and configured to induce a magnetic field in the at least one sensing element; and
  e) a means for attaching disposed between the at least one magnet and a first side surface of the at least one sensing element, such that the at least one magnet and the first side surface of the at least one sensing element are connected, allowing for movement of the at least one magnet in relation to the at least one sensing element.

2. A wireless proximity sensor as recited in claim 1, wherein the means for attaching is an biasing means for biasing the sensing element relative to the at least one magnet.

3. A wireless proximity sensor as recited in claim 1, wherein the substrate material of the body is selected from the group consisting of Quartz, $LiNbO_3$, AlN, $AlPO_4$, $LiTaO_3$, Lagasite, $Bi_4Ge_3O_{12}$ (BGO), GaAs and PZT.

4. A wireless proximity sensor as recited in claim 1, wherein the magnetostrictive material of the at least one sensing element is selected from the group consisting of TERFENOL-D, Galfenol, Cobalt, and Nickel.

5. A wireless proximity sensor as recited in claim 1, wherein the at least one transducer is adapted and configured to convert electromagnetic energy from the at least one first antenna into surface acoustic wave energy for propagation through the at least one sensing element and further adapted and configured to convert surface acoustic wave energy back into electromagnetic energy to the at least one first antenna.

6. A wireless proximity sensor as recited in claim 5, further comprising at least one movable target operatively positioned to produce a change in the magnetic field induced in the at least one sensing element based on the movement of the at least one movable target with respect to the at least one magnet.

7. A wireless proximity sensor as recited in claim 5, wherein the magnetostrictive material of the at least one sensing element is a thin film of magnetostrictive material deposited on the upper surface of the substrate material between the first end and the second end of the body.

8. A wireless proximity sensor as recited in claim 5, wherein the magnetostrictive material of the at least one sensing element is a block of bulk magnetostrictive material attached to the substrate material.

9. A wireless proximity sensor as recited in claim 8, wherein the block of bulk magnetostrictive material is larger than the body.

10. A wireless proximity sensor as recited in claim 8, wherein the block of bulk magnetostrictive material is smaller than the body.

11. The wireless proximity sensor of claim 1, wherein the magnetostrictive material of the at least one sensing element and the at least one interdigital transducer are made of Galfenol.

12. A wireless proximity sensing system comprising:
  a) a body formed of a substrate material having an upper surface, a lower surface, a first end and a second end;
  b) at least one interdigital transducer provided on a surface of the of the body, wherein each of the at least one interdigital transducers has at least one first antenna associated therewith;
  c) at least one sensing element formed of magnetostrictive material deposited on the substrate material between the first end and the second end;
  d) at least one magnet operatively positioned with respect to the body for providing a reference point of a position of an object, wherein the at least one magnet is adapted and configured to induce a magnetic field in the at least one sensing element;
  e) an attaching member disposed between the at least one magnet and a first side surface of the at least one sensing element, such that the at least one magnet and the first side surface of the at least one sensing element are connected, allowing for movement of the at least one magnet in relation to the at least one sensing element;
  f) a transceiver adapted and configured to generate a query signal to request information about a position of an object; and
  g) a second antenna for wirelessly receiving information about a position of an object from and transmitting information to the transceiver to the at least one first antenna.

13. A wireless proximity sensing system as recited in claim 12, wherein the attaching member is a biasing member.

14. A wireless proximity sensing system as recited in claim 12, wherein the substrate material of the body is selected from the group consisting of Quartz, $LiNbO_3$, AlN, $AlPO_4$, $LiTaO_3$, Lagasite, $Bi_4Ge_3O_{12}$ (BGO), GaAs and PZT.

15. A wireless proximity sensing system as recited in claim 12, wherein the magnetostrictive material of the at least one sensing element is selected from the group consisting of TERFENOL-D, Galfenol, Cobalt, and Nickel.

16. A wireless proximity sensing system as recited in claim 12, wherein the at least one transducer is adapted and configured to convert electromagnetic energy from the at least one first antenna into surface acoustic wave energy for propagation through the at least one sensing element and further adapted and configured to convert surface acoustic wave energy back into electromagnetic energy to the at least one first antenna.

17. A wireless proximity sensing system as recited in claim 16, further comprising at least one movable target operatively positioned to produce a change in the magnetic field induced in the at least one sensing element based on the movement of the at least one movable target with respect to the at least one magnet.

18. A wireless proximity sensing system as recited in claim 16, wherein the magnetostrictive material of the at least one sensing element is a thin film of magnetostrictive material deposited on the upper surface of the substrate material between the first end and the second end of the body.

19. A wireless proximity sensing system as recited in claim 16, wherein the magnetostrictive material of the at least one sensing element is a block of bulk magnetostrictive material attached to the substrate material.

20. A wireless proximity sensing system as recited in claim 19, wherein the block of bulk magnetostrictive material is larger than the body.

21. A wireless proximity sensing system as recited in claim 19, wherein the block of bulk magnetostrictive material is smaller than the body.

22. A method for wirelessly detecting the position of an object comprising:
   a) providing at least one SAW device having a sensing element adapted to produce a mechanical response in the at least one SAW device in response to a change in a magnetic field of the sensing element;
   b) providing at least one magnet movable relative to the sensing element and adapted to produce a change in the magnetic field of the sensing element based on movement of the at least one magnet;
   c) positioning at least one moveable target relative to the object so that movement of the at least one moveable target causes movement in the at least one magnet;
   d) wirelessly powering the at least one SAW device; and
   e) detecting information indicative of the mechanical response in the at least one SAW device relative to a change in the magnetic field of the sensing element, indicating the position of the object.

23. The method according to claim 22, wherein the step of detecting information indicative of the mechanical response, is further based on movement of the at least one magnet in response to movement of the at least one moveable target.

24. The method of claim 22, wherein the step of providing at least one magnet, further comprises the step of attaching the at least one magnet to the at least one SAW device and sensing element.

25. The method of claim 22, wherein the step of wirelessly powering the at least one SAW device further includes the step of sending a request for information indicative of a position of the at least one moveable target relative to the object from a transceiver.

26. The method of claim 25, further comprising wirelessly transmitting the information detected indicating the position of the object to the transceiver.

* * * * *